(12) United States Patent
Yuan et al.

(10) Patent No.: US 11,532,676 B2
(45) Date of Patent: Dec. 20, 2022

(54) DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Changlong Yuan, Beijing (CN); Xiaoxiao Wang, Beijing (CN)

(73) Assignees: Chengdu BOE Optoelectronics Technology Co., Ltd., Chengdu. Sichuan Province (CN); BOE Technology Group Co, , Ltd., Beijing (CN)

( * ) Notice: Subject to any disclaimer, the term of this patent is extended or adjusted under 35 U.S.C. 154(b) by 0 days.

(21) Appl. No.: 17/238,319

(22) Filed: Apr. 23, 2021

(65) Prior Publication Data

US 2022/0093704 A1 Mar. 24, 2022

(30) Foreign Application Priority Data

Sep. 18, 2020 (CN) .......................... 202010984726.9

(51) Int. Cl.
*G06V 40/13* (2022.01)
*H01L 27/32* (2006.01)
*H01L 51/52* (2006.01)

(52) U.S. Cl.
CPC ...... *H01L 27/3227* (2013.01); *G06V 40/1318* (2022.01); *H01L 27/3246* (2013.01); *H01L 27/3272* (2013.01); *H01L 51/5271* (2013.01)

(58) Field of Classification Search
CPC ............ G06V 40/1318; H01L 27/3272; H01L 27/3227
See application file for complete search history.

(56) References Cited

U.S. PATENT DOCUMENTS

| 9,548,344 | B2 * | 1/2017 | Ahn | H01L 27/3248 |
| 11,010,588 | B2 * | 5/2021 | He | G06V 40/1324 |
| 2019/0180071 | A1 * | 6/2019 | Kim | G06V 40/1318 |
| 2020/0380239 | A1 * | 12/2020 | Lee | G06V 10/141 |

* cited by examiner

*Primary Examiner* — Kevin M Nguyen
(74) *Attorney, Agent, or Firm* — ArentFox Schiff LLP; Michael Fainberg

(57) ABSTRACT

The present disclosure discloses a display panel and a display apparatus. The display panel includes a base substrate; a plurality of light emitting devices and a plurality of light sensors, disposed on the base substrate; thin film transistor structures disposed between the base substrate and the light emitting devices; a pixel definition layer configured to define positions of the light emitting devices; a first planarization layer disposed on a side, facing the base substrate, of the pixel definition layer; a light shading layer; and reflection parts each corresponding to a respective one of the light sensors; wherein: the light emitting devices are electrically connected with the thin film transistor structures; the reflection parts are disposed on sides, facing the base substrate, of the light sensors, and a side, facing the respective one reflection part, of the each light sensor is a light inlet side of the each light sensor.

14 Claims, 10 Drawing Sheets

DISPLAY PANEL AND DISPLAY APPARATUS

CROSS-REFERENCE TO RELATED APPLICATION

This application claims priority to Chinese Patent Application No. 202010984726.9, filed to the China Patent Office on Sep. 18, 2020, the entire contents of which are incorporated herein by reference.

FIELD

The present disclosure relates to the technical field of display, in particular to a display panel and a display apparatus.

BACKGROUND

In recent years, with the rapid development of touch control technologies, mobile products with a biological identification function gradually enter people's life and work, and the fingerprint identification technology has attracted people's attention by virtue of its unique identity characteristics. Press-type and slide-type fingerprint identification technologies based on a silicon-based technology have been integrated into the mobile products, and the fingerprint identification technology in a display area will be focused by people in the future.

SUMMARY

The embodiments of the present disclosure provide a display panel. The specific scheme is as follows.

The embodiments of the present disclosure provide the display panel, including: a base substrate, a plurality of light emitting devices and a plurality of light sensors disposed on the base substrate, thin film transistor structures disposed between the base substrate and the plurality of light emitting devices, a pixel definition layer configured to define the positions of the plurality of light emitting devices, and a first planarization layer disposed on a side, facing the base substrate, of the pixel definition layer; a light shading layer and reflection parts each corresponding to a respective one of the light sensors.

The plurality of light emitting devices are electrically connected with the thin film transistor structures; the reflection parts are disposed on sides, facing the base substrate, of the corresponding light sensors, and a side, facing the respective one reflection part, of the each light sensor is the light inlet side of the each light sensor; light-transmitting regions each corresponding to a respective one of the light sensors are disposed in the light shading layer, and an orthographic projection of the each light-transmitting region on the base substrate is not overlapped with an orthographic projection of the respective one light sensor on the base substrate; the light shading layer is disposed on a side, facing away from the base substrate, of the thin film transistor structures, and at least an overlapping area exists between an orthographic projection of the light shading layer on the base substrate and orthographic projections of the light sensors on the base substrate.

Optionally, each of the light sensors includes a first electrode, a photoelectric conversion layer and a second electrode stacked sequentially; a material of the first electrode is a transparent conductive material; and the first electrode is disposed between the photoelectric conversion layer and the base substrate.

Each of the light emitting devices includes an anode, a light emitting layer and a cathode layer; the anode, the light emitting layer and the cathode layer are stacked, and the anode is disposed between the light emitting layer and the base substrate.

Optionally, the light shading layer is disposed between the pixel definition layer and the thin film transistor structures; or the light shading layer is reused as the pixel definition layer; and the light sensors are disposed between the light shading layer and the reflection parts; or the light sensors penetrate through the light shading layer in a direction perpendicular to the base substrate.

Optionally, the light shading layer is disposed between the thin film transistor structures and the plurality of light emitting devices, and the light shading layer is reused as the first planarization layer; and the plurality of light emitting devices and the thin film transistor structures are electrically connected through via holes penetrating through the first planarization layer.

Optionally, a layer where the second electrode of the light sensor is located is same as a layer where the anode of the plurality of light emitting device is located, and a material of the second electrode is same as a material of the anode.

Optionally, the display panel further includes: a second planarization layer disposed between the first planarization layer and the thin film transistor structures, and a connection electrode disposed between the second planarization layer and the first planarization layer; and the plurality of light emitting devices are electrically connected with the thin film transistor structures through the connection electrode.

Optionally, a layer where the first electrode or the second electrode of the light sensor is located is same as a layer where the connection electrode is located, and a material of the first electrode or a material of the second electrode is same as a material of the connection electrode.

Optionally, the layer where the first electrode of the light sensor is located is same as the layer where the connection electrode is located, and the material of the first electrode is same as the material of the connection electrode; and the layer where the second electrode of the light sensor is located is same as the layer where the anode of the light emitting device is located, and the material of second electrode is same as the material of the anode.

Optionally, the layer where the second electrode of the light sensor is located is same as the layer where the connection electrode is located, and the material of the second electrode is same as the material of the connection electrode; and the layer where the first electrode of the light sensor is located is same as a layer where source and drain electrodes or gate electrodes of the thin film transistor structures are located, and the material of the first electrode is same as a material of the drain electrodes or the gate electrodes of the thin film transistor structures.

Optionally, the light shading layer is reused as the pixel definition layer; a layer where the first electrode of the light sensor is located is same as a layer where a transparent conductive layer in the anode of the light emitting device is located; and the material of the first electrode is same as a material of the transparent conductive layer; and/or, a layer where the second electrode of the light sensos is located is same as a layer where the cathode layer of the light emitting device is located, and the material of the second electrode is same as a material of the cathode layer.

Optionally, the light shading layer includes light shading parts each corresponding to the respective one of the light sensors, and an orthographic projection of the each light shading part on the base substrate covers the orthographic projection of the respective one light sensor on the base substrate; and the each light-transmitting region corresponding to the respective one light sensor surround the light shading part corresponding to the respective one light sensor.

Optionally, the anode includes an anode metal layer, and the anode is reused as the light shading part.

Optionally, the second electrode of the light sensors is a metal electrode, and the second electrode of the light sensor is reused as the light shading part corresponding to the light sensor.

Optionally, the display panel further includes: a light shielding layer disposed between the thin film transistor structures and the base substrate, the light shielding layer configured to shield light rays on the side, facing away from the light shielding layer, of the base substrate from irradiating the thin film transistor structures; and a layer where the reflection parts are located is same as a layer where the light shielding layer is located, and a material of the reflection parts is same as a material of the light shielding layer.

Accordingly, the embodiments of the present disclosure also provides a display apparatus including any display panel described above.

DETAILED DESCRIPTION OF THE EMBODIMENTS

Figure 1:
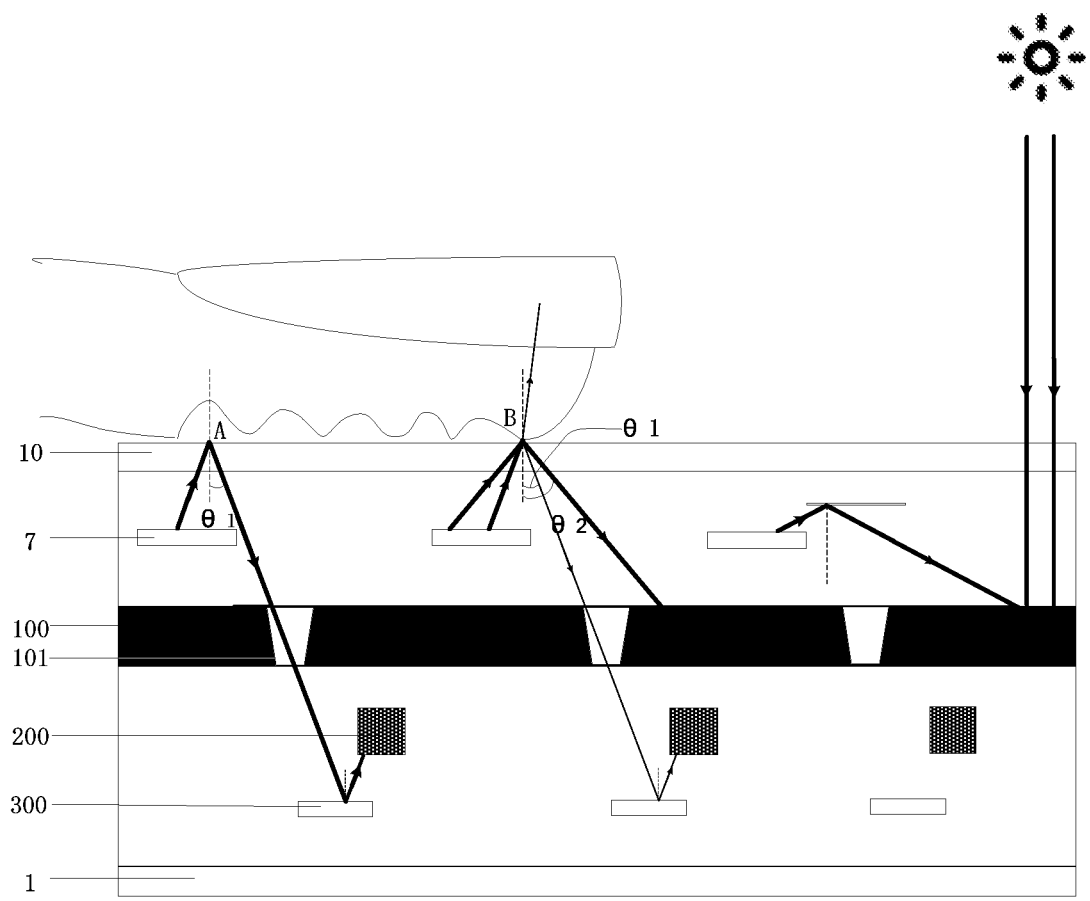
FIG. 1 is a first schematic structural diagram of a display panel according to an embodiment of the present disclosure.

To further clarify the above objects, features and advantages of the present disclosure, a more particular description of the present disclosure will be rendered with reference to the appended drawings and embodiments. However, the exemplary implementations can be implemented in a variety of forms and should not be construed as limited to the implementations set forth herein; rather, these implementations are provided, so that the present disclosure will be thorough and complete, and the concept of exemplary implementations is fully conveyed to those skilled in the art. In the drawings, the same reference signs denote the same or similar structures, and thus a repeated description thereof will be omitted. The words expressing positions and orientations described in the present disclosure are illustrated by way of examples in the accompanying drawings and may be varied as required, and the variations are intended to be within the scope of the present disclosure. The drawings of the present disclosure are only intended to illustrate relative positional relationships and are not to scale.

It is noted that in the following description, specific details are set forth in order to provide a thorough understanding of the present disclosure. This disclosure may, however, be embodied in many different forms from those herein set forth and will be readily apparent to those skilled in the art without departing from the spirit or scope of the disclosure. Hence, the present disclosure will not be limited by the specific implementations disclosed below. The following description is of the preferred implementation for carrying out the present application, but is for the purpose of illustrating the general principles of the present application and is not intended to limit the scope of the present application. It is intended that the scope of the present application is defined by the claims appended hereto.

Hereinafter, a display panel and a display apparatus provided according to embodiments of the present disclosure will be described in detail with reference to the accompanying drawings.

The display panel provided according to the embodiments of the present disclosure, as shown in FIGS. 1 to 17, includes a base substrate 1, a plurality of light emitting devices 7 disposed on the base substrate 1, and a plurality of light sensors 200 disposed on the base substrate 1. As shown in FIGS. 2 to 17, the display panel further includes thin film transistor structures 4 disposed between the base substrate 1 and the plurality of light emitting devices 7, a pixel definition layer 6 configured to define the positions of the plurality of light emitting devices 7, and a first planarization layer 5-1 disposed on a side, facing the base substrate 1, of the pixel definition layer 6; and the plurality of light emitting devices 7 are electrically connected with the thin film transistor structures 4.

The display panel further includes a light shading layer 100 and reflection parts 300 each corresponding to a respective one of the light sensors 200; the reflection parts 300 are disposed on sides, facing the base substrate 1, of the corresponding light sensors 200, and a side, facing the respective one reflection parts 300, of the each light sensor 200 is light inlet sides of the light sensor.

Light-transmitting regions 101 each corresponding to a respective one of the light sensors 200 are disposed in the light shading layer 100, and an orthographic projection of the each light-transmitting region 101 on the base substrate 1 is not overlapped with an orthographic projection of the respective one light sensor 200 on the base substrate 1; the light-transmitting regions 101 are configured to enable light emitted by the light emitting devices 7 to be incident to the reflection parts 300 after being reflected by a fingerprint; and the light shading layer 100 is disposed on a side, facing away from the base substrate 1, of the thin film transistor structures 4, and at least an overlapping area exists between an orthographic projection of the light shading layer 100 on the base substrate 1 and orthographic projections of the light sensors 200 on the base substrate 1.

Thus, by arranging the light shading layer on the display panel and arranging the light-transmitting regions on the light shading layer, most of external ambient light can be shaded and absorbed by reasonably arranging the positions of the light-transmitting regions, the reflection parts and the light sensors, and light reflected after the light emitting devices irradiate the fingerprint can enter the a side, facing away from the light emitting device, of the light shading layer through the light-transmitting regions at a proper angle and is reflected again through the reflection parts to the light inlet sides of the light sensors. Finally, the light sensors reduce the received external ambient light and the signal-to-noise ratio is improved.

In a specific implementation process, in order to further improve the signal-to-noise ratio, the orthographic projection of the light shading layer 100 on the base substrate 1 covers the orthographic projections of the plurality of light sensors 200 on the base substrate 1.

In a specific implementation process, as shown in FIGS. 1 to 17, the reflection parts 300 are configured to reflect light rays incident to the reflection parts after being reflected by the fingerprint to the light inlet sides of the light sensors 200. The reflection parts 300 may be disposed on a side, facing the light sensors 200, of the base substrate 1; and the reflection parts may also be disposed on a side, facing away from the light sensors 200, of the base substrate 1, which is not limited thereto.

In a specific implementation process, as shown in FIG. 1, the display panel further includes a glass top cover plate 10. The light emitting devices 7 are disposed on a side, facing away from the base substrate, of the light shading layer 100, and the light sensors 200 are disposed below a side, facing the base substrate, the light shading layer 100.

The working principle of the display panel is as follows: when fingerprint identification is performed, a user presses a finger against the top cover plate 10. At this time, light rays emitted by the light emitting devices 7 irradiate the top cover plate 10. A refractive index $n_{air}$ of air is 1, a refractive index $n_{glass}$ of glass is 1.5, and a refractive index $n_{skin}$ of finger skin is nearly equal to 1.39. Since valleys of the finger are not in actual contact with the top cover plate, the critical angles at which total reflection of light rays occurs at the valleys and ridges of the fingerprint are different. If the light rays irradiate the valleys of the fingerprint, such as a point A shown in the FIG. 1, the critical angle $\theta_1$ of total reflection of light is $$\arcsin\frac{n_{air}}{n_{glass}} \approx 41.8°;$$

and if the light rays irradiate the ridges of the fingerprint, such as a point B shown in the FIG. 1, the critical angle $\theta_2$ of total reflection of light is $$\arcsin\frac{n_{skin}}{n_{glass}} \approx 67.92°.$$

By reasonably arranging the positions of the light emitting devices 7, the light-transmitting regions 101 and the reflection parts 300, the display panel enables the light-transmitting regions 101 to mainly transmit light rays with a reflection angle between $\theta_1$ and $\theta_2$ at a fingerprint position.

Then, if the light rays irradiate the valleys of the fingerprint, the light rays which pass through the light-transmitting regions 101 and enter the light sensors 200 after being reflected by the reflection parts 300 are light rays totally reflected, and the light intensity of the light rays is large. If the light rays irradiate the ridges of the fingerprint, the light rays which pass through the light-transmitting regions 101 and enter the light sensors 200 after being reflected by the reflection parts 300 are not totally reflected, part of the light rays are refracted, and the light intensity of the reflected light rays is small. Thus, the valleys and the ridges of the fingerprint can be judged by different light intensities of the light rays received by the light sensors 200. Meanwhile, the light shading layer 100 can shade and absorb external ambient light. For noise light inside the display panel, noise light is mainly formed by light emitted by the light emitting devices 7 is reflected after irradiating other structures of the display panel. Most of this noise light can also be shaded and absorbed by the light shading layer 100 arranged in a whole layer.

In a specific implementation process, the light emitting devices may be organic light-emitting diodes (OLEDs) or other light emitting devices, which is not limited thereto. As shown in FIGS. 2 to 17, each light emitting device 7 includes an anode 7-1, a light emitting layer 7-2, and a cathode layer 7-3, the anode 7-1, the light emitting layer 7-2, and the cathode layer 7-3 are sequentially stacked near a side of the base substrate.

Each light sensor 200 includes a first electrode 210, a photoelectric conversion layer 230, and a second electrode 220.

Figure 16:
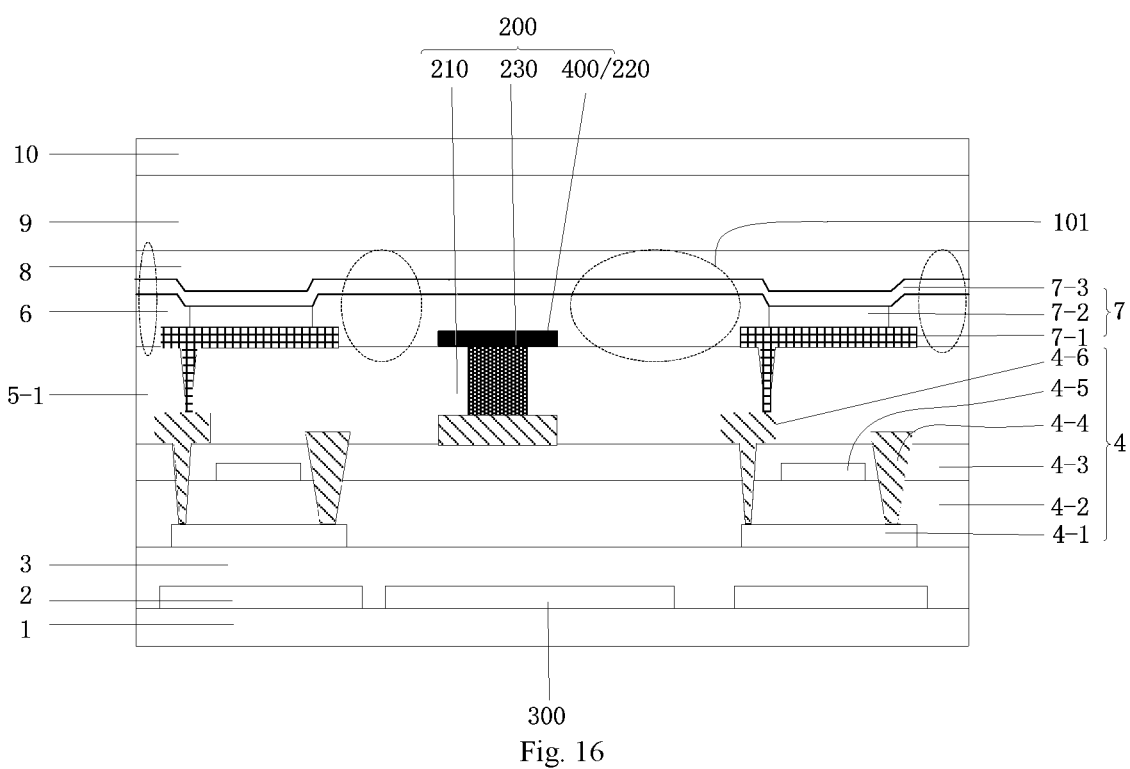
FIG. 16 is a sixteenth schematic structural diagram of a display panel according to an embodiment of the present disclosure.
Figure 17:
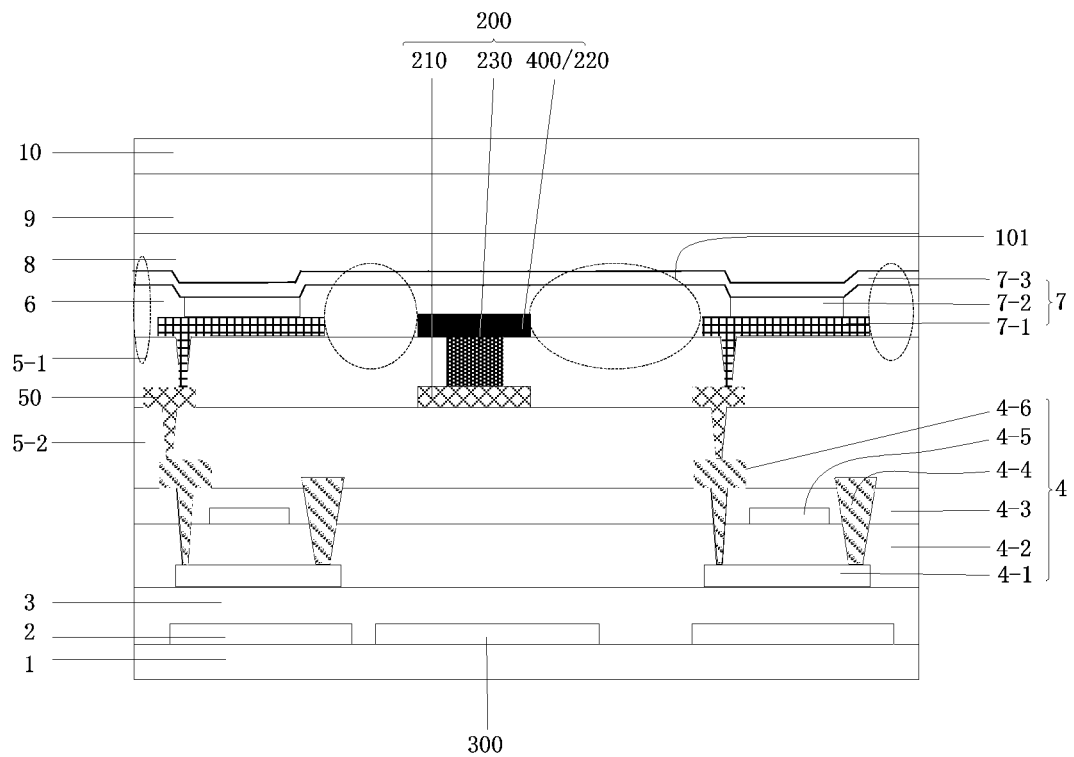
FIG. 17 is an seventeenth schematic structural diagram of a display panel according to an embodiment of the present disclosure.
Figure 18:
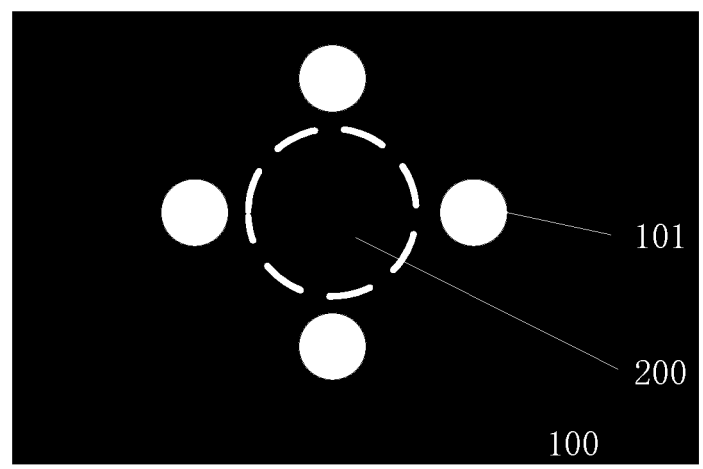
FIG. 18 is a first top view of a light-transmitting region of a light shading layer according to an embodiment of the present disclosure.
Figure 19:
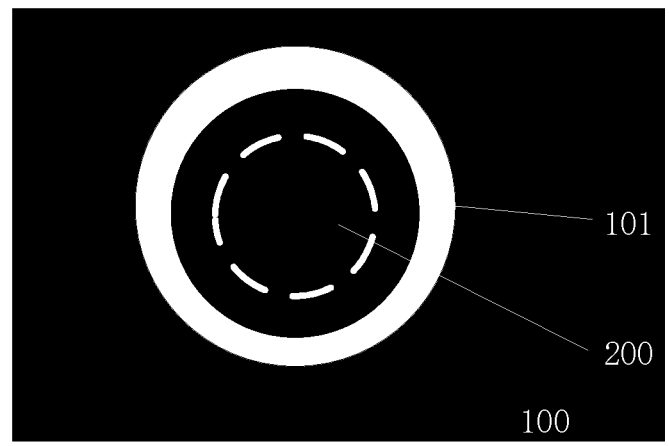
FIG. 19 is a second top view of a light-transmitting region of a light shading layer according to an embodiment of the present disclosure.

In a specific implementation process, as shown in FIG. 18, the light-transmitting region 101 corresponding to each light sensor 200 may be a plurality of light-transmitting holes around the light sensor 200; or as shown in FIG. 19, the light-transmitting region 101 corresponding to each light sensor 200 may also be an annular light-transmitting region disposed around the light sensor 200; or, as shown in FIGS. 11, 12, 13, 15, 16, and 17, the light-transmitting regions 101 may be gaps between light shading parts 400 in the light shading layer and other lightproof structures, which is not limited thereto.

In a specific implementation process, as shown in FIGS. 2 to 17, the display panel further includes a thin film packaging layer 8, a touch function layer 9 and the top cover plate 10 which are sequentially stacked on the cathode layer 7-3 of the light emitting device 7. The thin film packaging layer 8 is configured to protect the light emitting devices 7 from liquid and air during use of the display panel. The touch function layer 9 is configured to realize a touch function of the display panel. The touch function layer 9 generally further includes a touch electrode (not shown).

Optionally, as shown in FIGS. 2 to 17, each light sensor 200 includes the first electrode 210, the photoelectric conversion layer 230, and the second electrode 220 which are sequentially stacked.

The material of the first electrodes 210 is a transparent conductive material, and the first electrodes 210 are disposed between the photoelectric conversion layers 230 and the base substrate 1.

Figure 20:
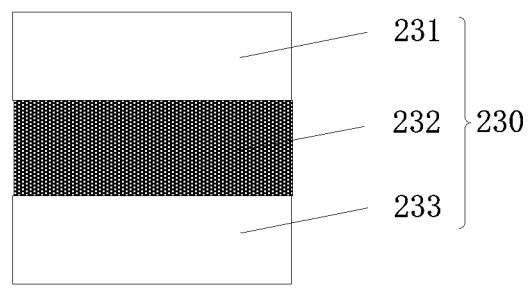
FIG. 20 is a first schematic structural diagram of a photoelectric conversion layer of a light sensor according to an embodiment of the present disclosure.
Figure 21:
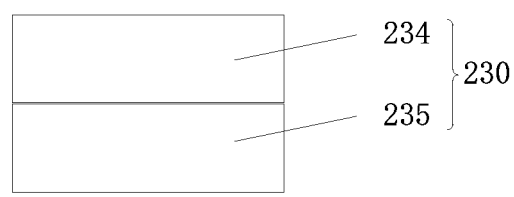
FIG. 21 is a second schematic structural diagram of a photoelectric conversion layer of a light sensor according to an embodiment of the present disclosure.

In a specific implementation process, the light sensors 200 may be photodiodes. The photodiodes may be PN-type photodiodes. As shown in FIG. 20, each photoelectric conversion layer 230 is a PN junction including a P-type semiconductor 231, a depletion region 232, and an N-type semiconductor 233. Optionally, the photodiodes are PIN-type photodiodes. As shown in FIG. 20, each photoelectric conversion layer 230 includes a P-type semiconductor 231, an intrinsic semiconductor 232, and an N-type semiconductor 233. Or, the photodiodes are organic photodiodes (OPDs). As shown in FIG. 21, each photoelectric conversion layer 230 includes a donor 234 and an acceptor 235. In a specific implementation process, the light sensors may also e another sensors, which not limited thereto. The material of the first electrodes may be metal oxides such as ZnO, Indium Tin Oxide (ITO), Indium Gallium Zinc Oxide (IGZO), or other transparent conductive material, which is not limited thereto.

Thus, by arranging the first electrodes of the light sensors as the transparent material, light rays reflected by the reflection parts can enter the photoelectric conversion layers from the irst electrodes.

Optionally, as shown in FIGS. 2 to 17, each thin film transistor structure 4 includes an active layer 4-1, an interlayer dielectric layer 4-2, a gate insulating layer 4-3, a source electrode 4-4, a drain electrode 4-6, and a gate electrode 4-5. A buffer layer 3 is disposed between the thin film transistor structures 4 and the base substrate 1 to protect the thin film transistor structures 4.

Accordingly, the thin film transistor structures 4 in FIGS. 2 to 17 are illustrated as top gate structures, and the thin film transistor structures in the embodiments of the present disclosure may be the top gate structures or bottom gate structures, which is not limited thereto. The positions of the source electrode 4-4 and the drain electrode 4-6 of each thin film transistor structure 4 may be interchanged, which is not limited thereto.

Figure 2:
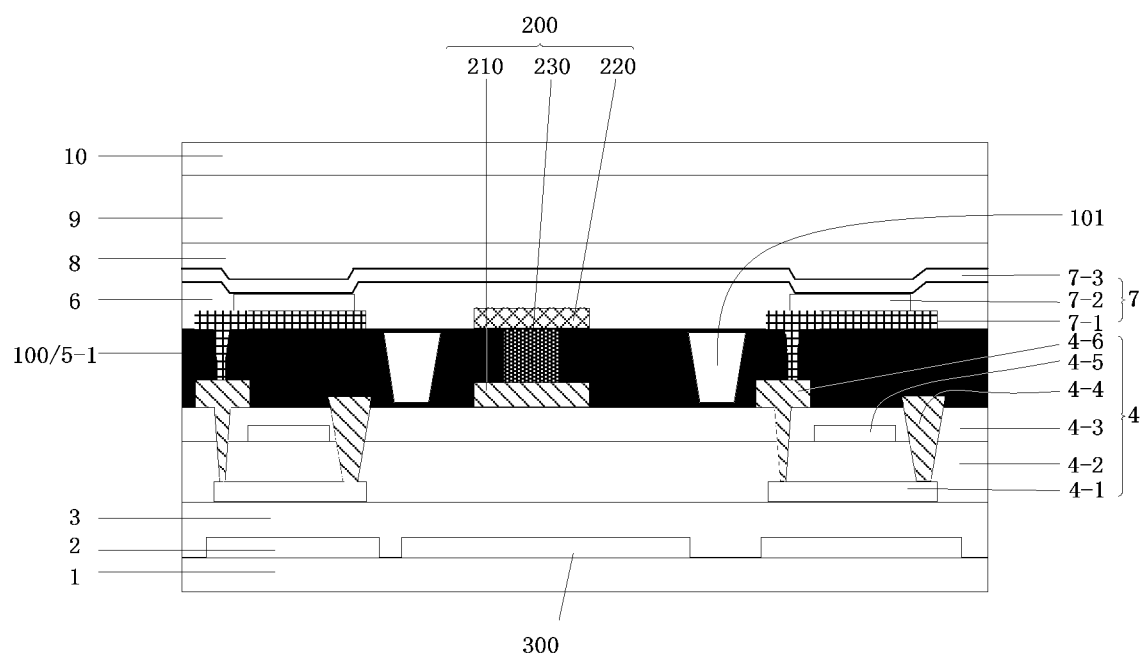
FIG. 2 is a second schematic structural diagram of a display panel according to an embodiment of the present disclosure.
Figure 3:
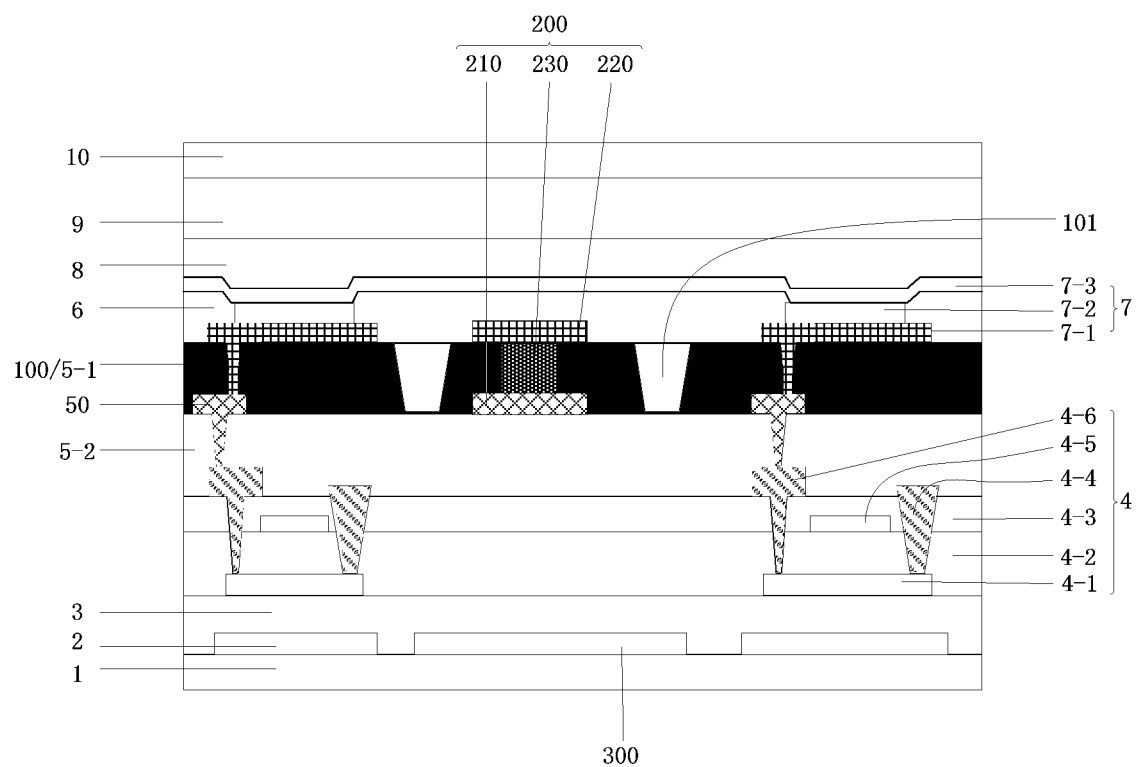
FIG. 3 is a third schematic structural diagram of a display panel according to an embodiment of the present disclosure.
Figure 4:
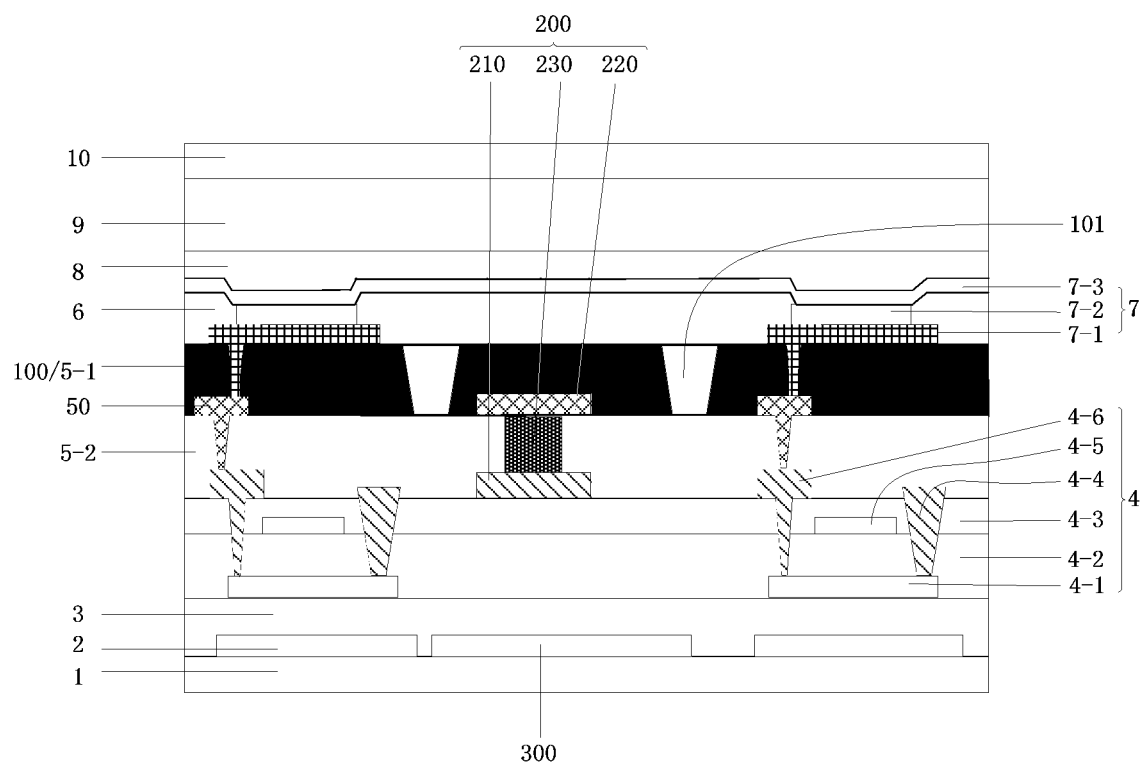
FIG. 4 is a fourth schematic structural diagram of a display panel according to an embodiment of the present disclosure.
Figure 5:
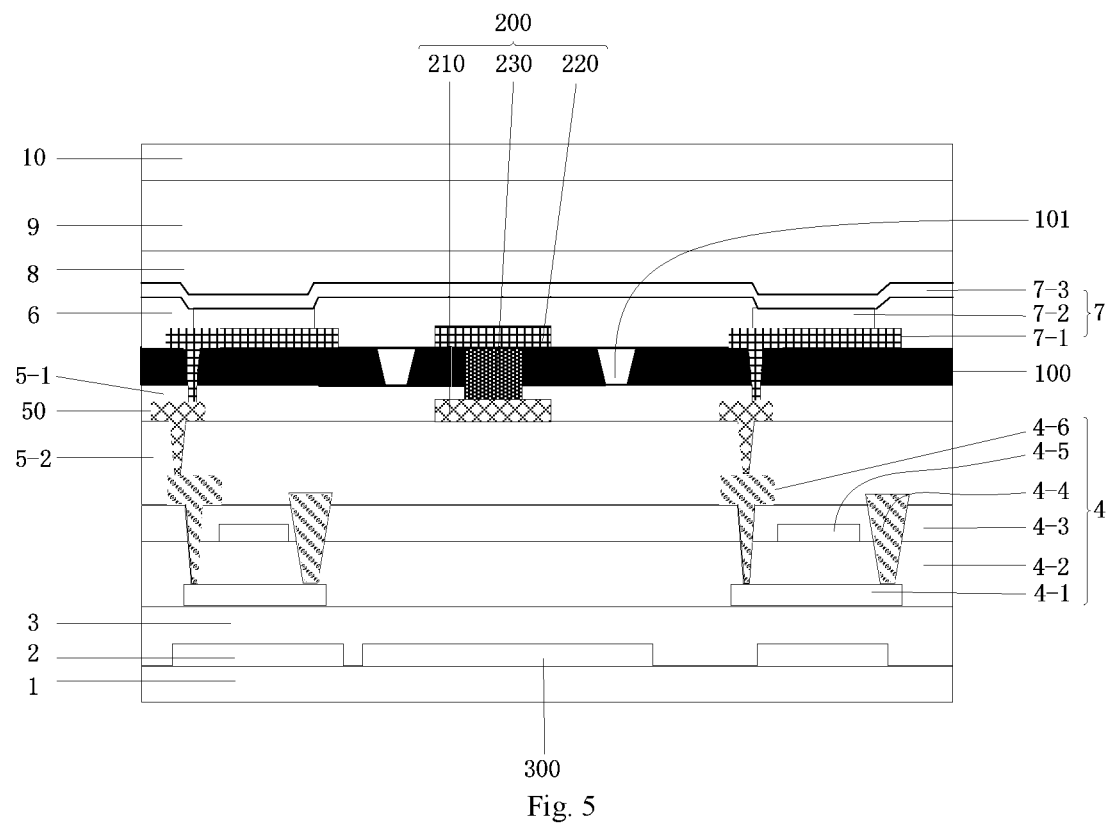
FIG. 5 is a fifth schematic structural diagram of a display panel according to an embodiment of the present disclosure.
Figure 6:
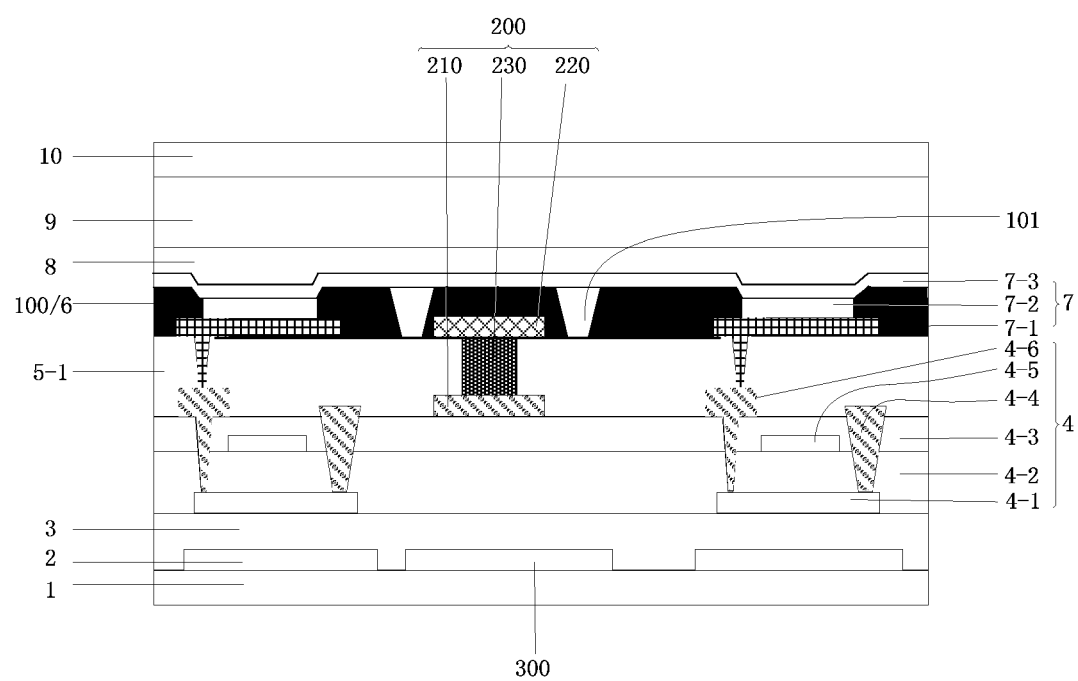
FIG. 6 is a sixth schematic structural diagram of a display panel according to an embodiment of the present disclosure.
Figure 7:
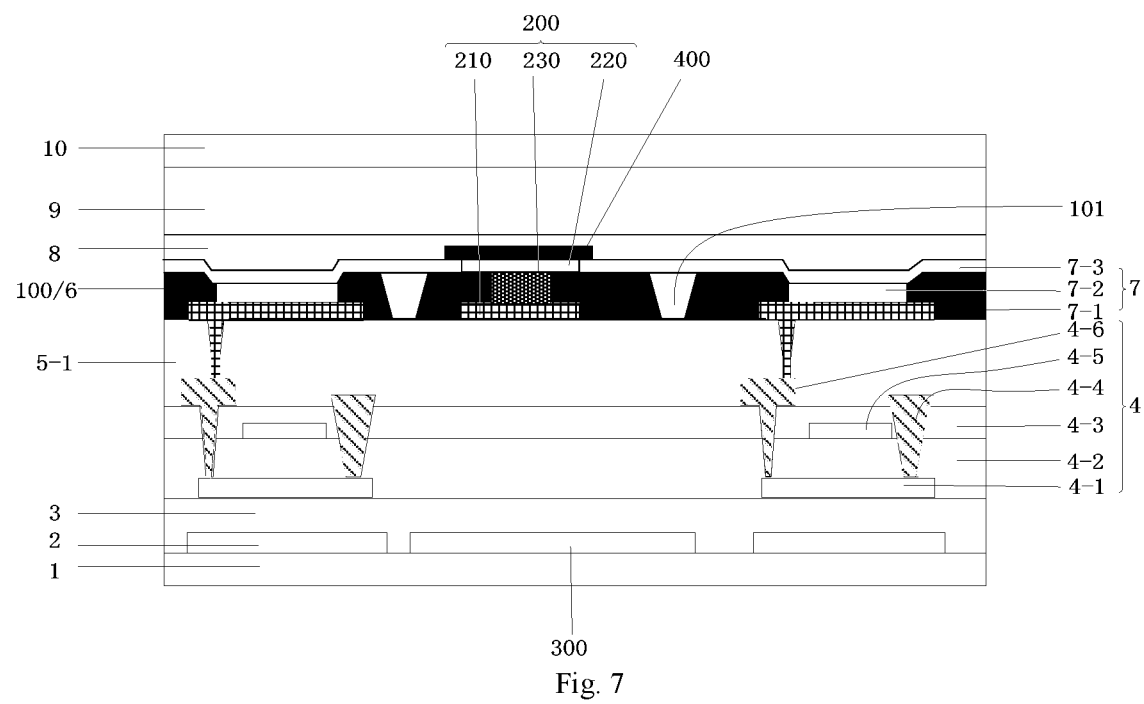
FIG. 7 is a seventh schematic structural diagram of a display panel according to an embodiment of the present disclosure.
Figure 8:
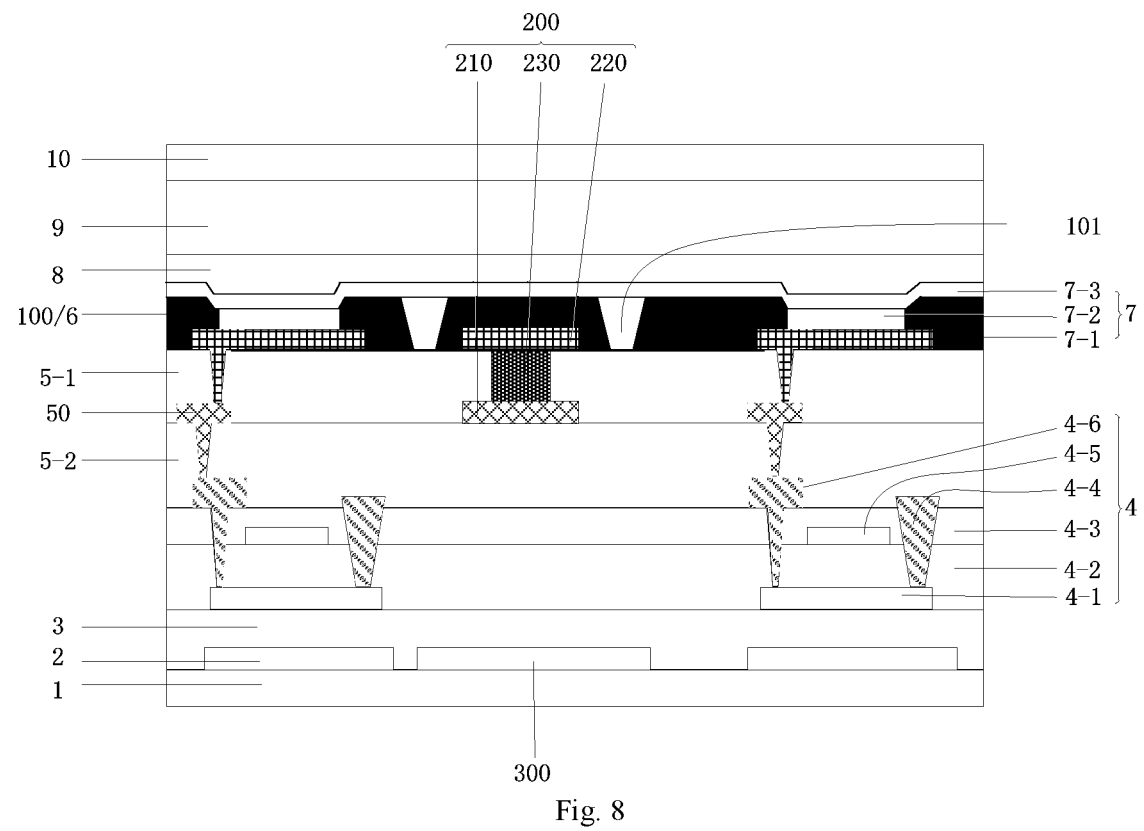
FIG. 8 is an eighth schematic structural diagram of a display panel according to an embodiment of the present disclosure.

Optionally, in the display panel provided according to the embodiments of the present disclosure, as shown in FIGS. 2 to 5, the light shading layer is disposed between the pixel definition layer 6 and the thin film transistor structures 4. Accordingly, as shown in FIG. 5, the light shading layer 100 may be an additional film layer. Other film layers between the pixel definition layer 6 and the thin film transistor structures 4 can also be reused as the light shading layer, for example, as shown in FIGS. 2 to 4, the light shading layer 100 is reused as the first planarization layer 5-1, that is, after being made of a light shading material and forming light-transmitting regions, the first planarization layer 5-1 has the same function as the light shading layer 100.

Or, optionally, in the display panel provided according to the embodiments of the present disclosure, as shown in FIGS. 6 to 10, the light shading layer 100 is reused as the pixel definition layer 6, that is, after being made of a light shading material and forming light-transmitting regions, the pixel definition layer 6 has the same function as the light shading layer 100.

Optionally, in the display panel provided according to the embodiments of the present disclosure, as shown in FIGS. 4, 6, 8, 9, 11, 12, 13 and 14, the light sensors 200 are disposed between the light shading layer 100 and the reflection parts 300.

Or, optionally, in the display panel provided according to the embodiments of the resent disclosure, as shown in FIGS. 2, 3, 5, 7 and 10, the light sensors 200 penetrate through the light shading layer 100 in a direction perpendicular to the base substrate 1.

Figure 15:
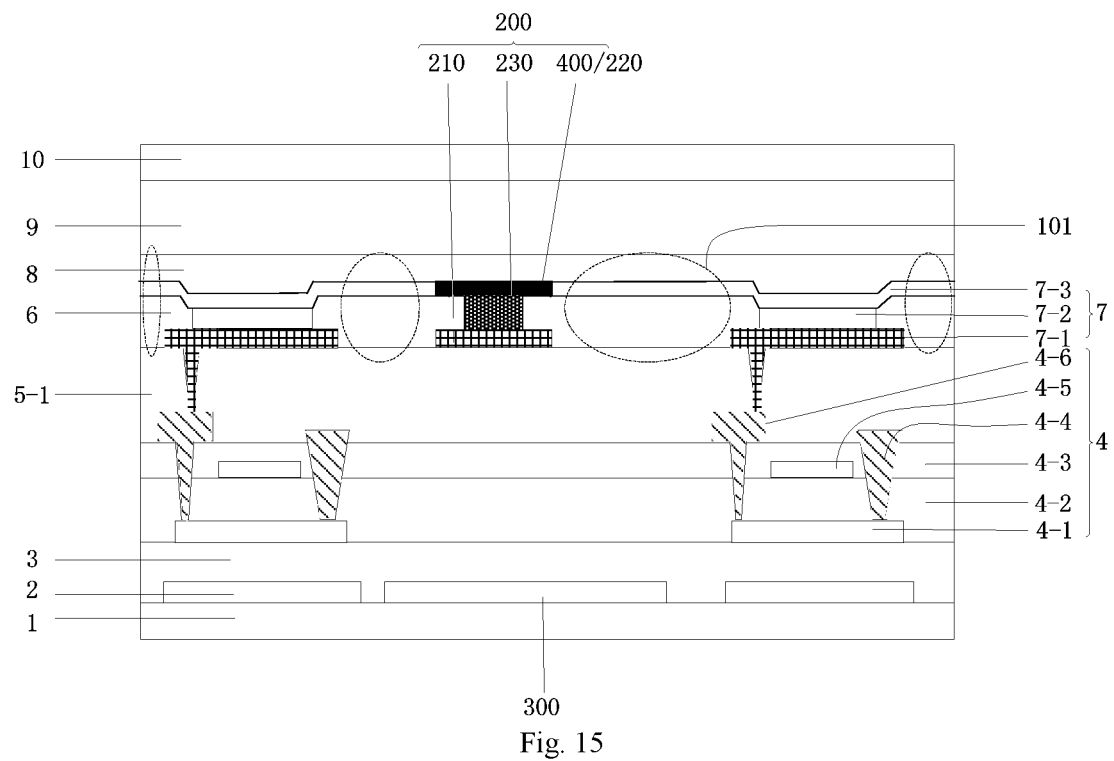
FIG. 15 is a fifteenth schematic structural diagram of a display panel according to an embodiment of the present disclosure.

In a specific implementation process, as shown in FIGS. 2, 3, 5, 7 and 10, all or part of the photoelectric conversion layer 230 of the each light sensor is embedded in the light shading layer 100. Or, as shown in FIGS. 15, 16 and 17, the second electrode 220 of the light sensor 200 are made of a metal reflective material and are reused as the light shading parts 400. That is to say, the layer where the second electrode 220 of the light sensor 200 is located can be regard as the light shading layer.

Thus, the light shading layer is disposed on the backlight sides of the light emitting devices, the light sensors are disposed on or below the light shading layer, and on the premise that the display and the fingerprint irradiation of the light emitting devices are not influenced, most of ambient light is shaded and absorbed from entering the light inlet sides of the light sensors; and the light shading layer disposed in the whole layer can also shade and absorb noise light inside the display panel from entering the light inlet sides of the light sensors.

Optionally, as shown in FIG. 2, the light shading layer 100 is disposed between the thin film transistor structures 4 and the light plurality of emitting devices 7, and the light shading layer 100 is reused as the first planarization layer 5-1; the plurality of light emitting devices 7 and the thin film transistor structures 4 are electrically connected through via holes penetrating through the light shading layer 100.

In a specific implementation process, the light sensors 200 penetrate through the light shading layer 100 in a direction perpendicular to the base substrate 1, a layer where the first electrodes of the light sensor 200 is located may be same as a layer where the drain electrode 4-6 of the thin film transistor structures 4 is located, and a layer where the second electrode 220 of the light sensor is located is same as the a layer where the anode 7-1 of the light emitting device 7 is located. The first electrode and the second electrode of the light sensor may also be disposed separately, which is not limited thereto.

Therefore, by reusing the light shading layer as the first planarization layer, the structure of the display panel is simplified, the production process of the panel is optimized, and the production cost is reduced.

Optionally, as shown in FIGS. 2, 3, 5, 6, 8, 12, 13, 16 and 17, the layer where the second electrode 220 of the light sensor 200 is located is same as the layer where the anode 7-1 of the light emitting device 7 is located, and a material of the second electrode 220 is same a material of the anode 7-1.

Therefore, the second electrode of the light sensor and the anode of the light emitting device are disposed in the same layer and made of the same material, so that the structure of the display panel is simplified, the production process of the panel is optimized, and the production cost is reduced. On the other hand, since the anode of the light emitting device generally include anode metal layer, the reflectivity is achieved. The second electrode of the light sensor and the anode of the light emitting device are disposed in the same layer and made of the same material, so that the shielding capability of the second electrode of the light sensor to external ambient light and noise light is further enhanced, and the signal-to-noise ratio of the display panel is higher.

Optionally, as shown in FIGS. 3, 4, 5, 8, 9, 10, 13, 14 and 17, the display panel further includes: a second planarization layer 5-2 disposed between the first planarization layer 5-1 and the thin film transistor structures 4, and connection electrodes 50 disposed between the second planarization layer 5-2 and the first planarization layer 5-1; and the light emitting devices 7 are electrically connected with the connection electrodes 50, and the connection electrodes 50 are electrically connected with the thin film transistor structures 4.

Therefore, by arranging the second planarization layer, the distance between the light sensor and the light shading part is increased, the relative position of the light sensor and the light shading part is favorably arranged, and light rays entering from the light-transmitting regions of the light shading layer are reflected to the first electrode of the light sensor at a proper angle. By arranging the connection electrodes between the first planarization layer and the second planarization layer, the problem that each light emitting device is directly electrically connected with the corresponding thin film transistor structure and a via hole which penetrates through the first planarization layer and the second planarization layer at the same time and is large in depth is solved. Two via holes with smaller depths can be formed in the two planarization layers correspondingly, and then the connection electrodes are electrically connected with electrodes in the two via holes, so that the difficulty of a patterning process is reduced.

Optionally, as shown in FIGS. 3, 4, 5, 8, 9, 13, 14 and 17, a layer where the first electrode 210 or the second electrode 220 of the light sensor 200 is located is same as a layer where the connection electrode 50 is located, and the material of the first electrode 210 or the second electrode 220 is same as a material of the connection electrode 50.

In a specific implementation process, as shown in FIGS. 3, 5, 8, 13 and 17, the layer where the first electrode 210 of the light sensor 200 is located is same as the layer where the connection electrode 50 is located, the material of the first electrode 210 is same as the material of the connection electrode 50, and the first electrode 210 of the light sensor 200 and the connection electrode 50 are both made of transparent conductive materials. The materials of the first electrodes 210 and the connection electrodes 50 may be metal oxide such as ZnO, Indium Tin Oxide (ITO), and Indium Gallium Zinc Oxide (IGZO), or other transparent conductive materials, which is not limited thereto.

Figure 9:
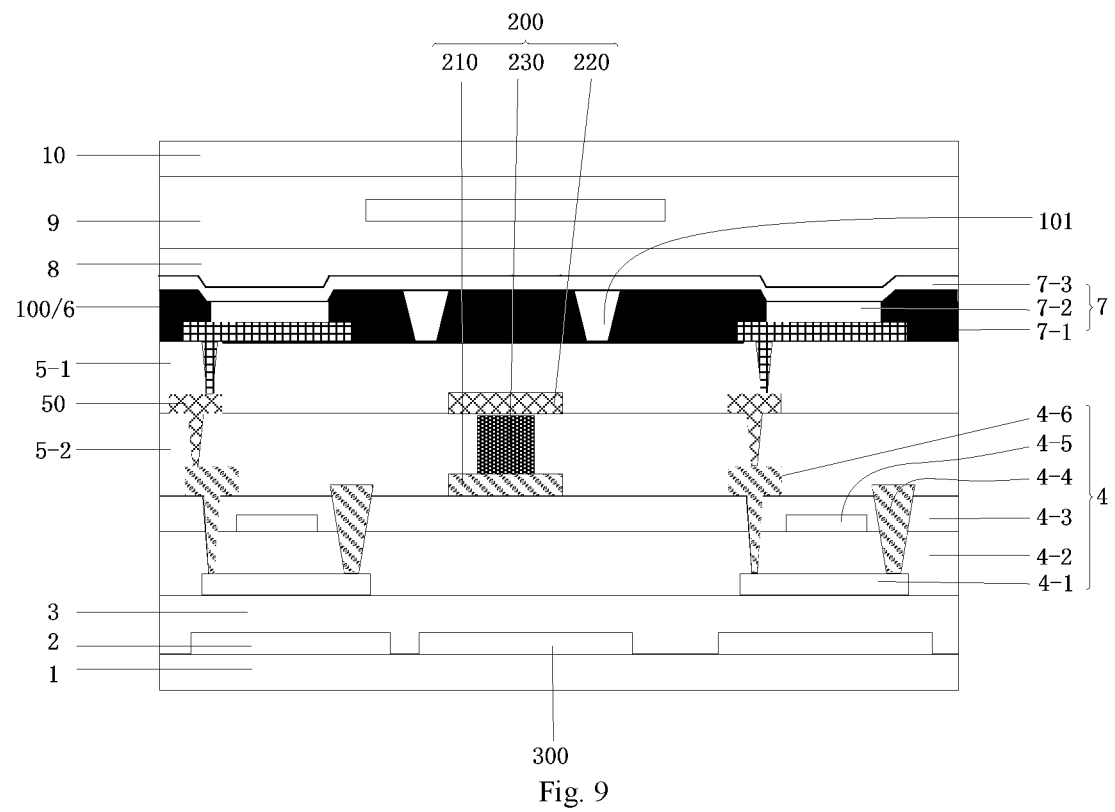
FIG. 9 is a ninth schematic structural diagram of a display panel according to an embodiment of the present disclosure.
Figure 10:
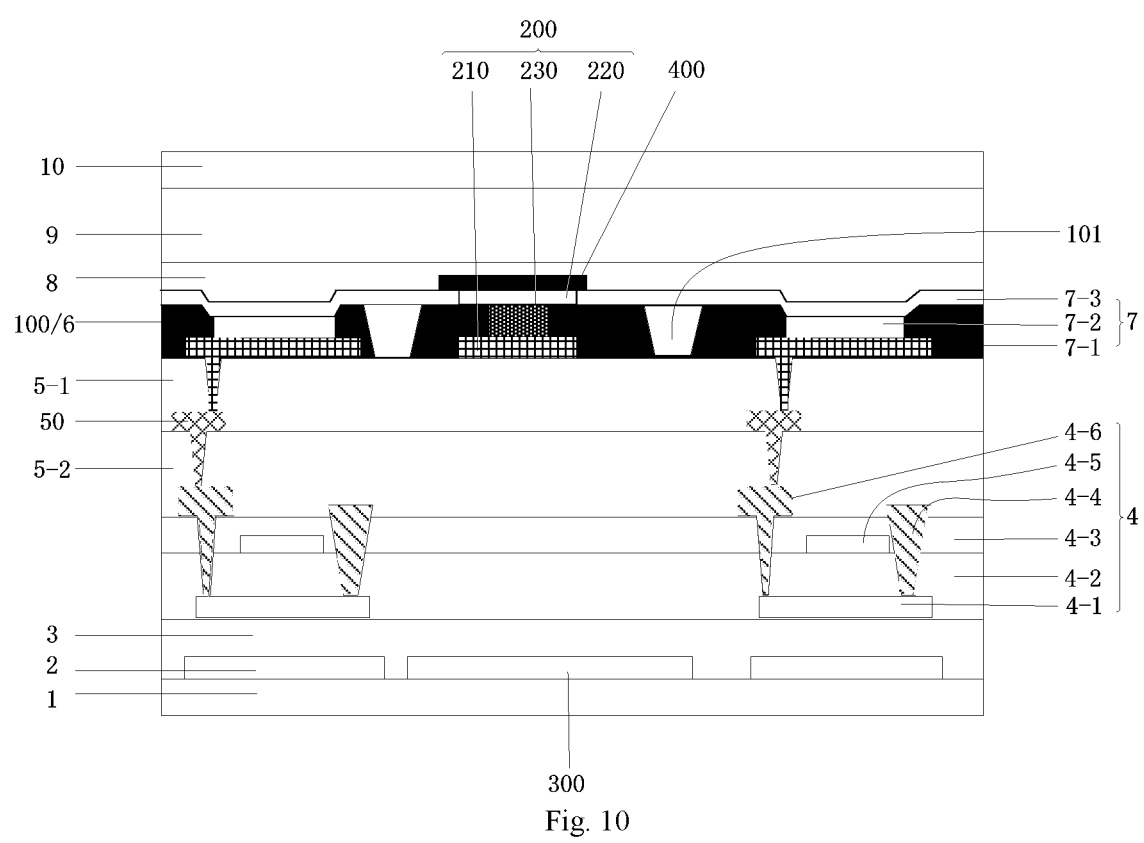
FIG. 10 is a tenth schematic structural diagram of a display panel according to an embodiment of the present disclosure.
Figure 14:
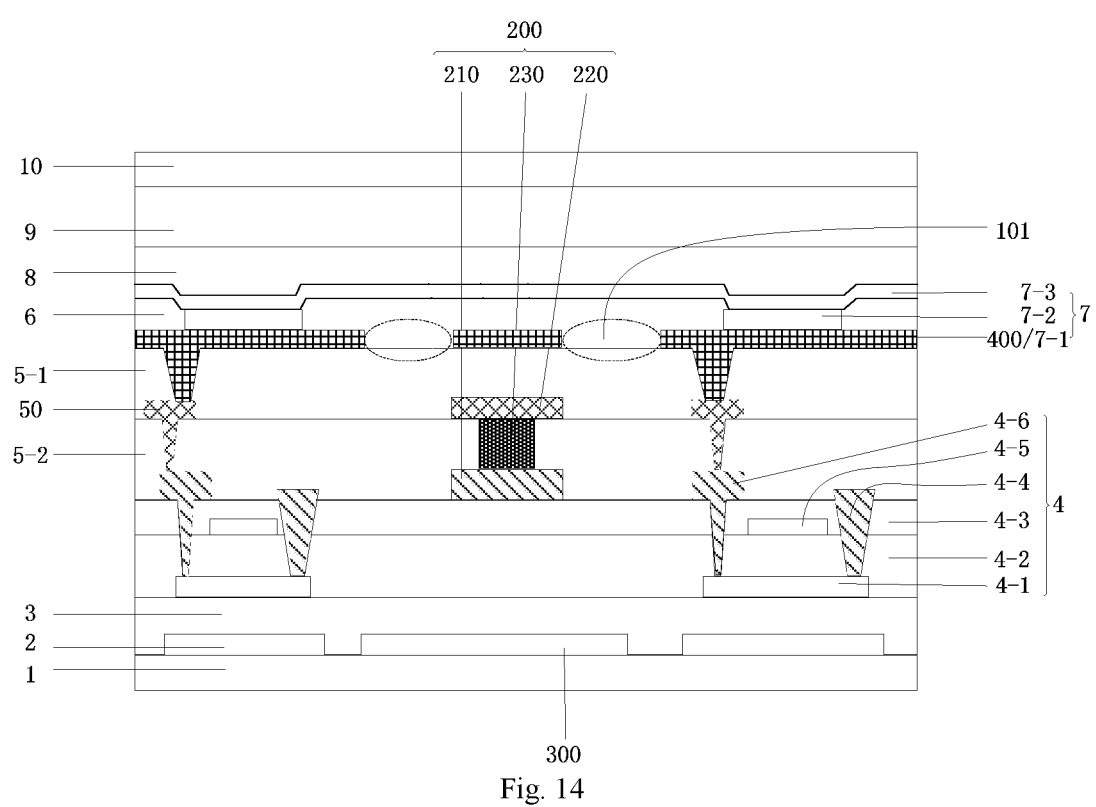
FIG. 14 is a fourteenth schematic structural diagram of a display panel according to an embodiment of the present disclosure.

Or, as shown in FIGS. 4, 9 and 14, the layer where the second electrode 220 of the light sensor 200 is located is same as the layer where the connection electrode 50 is located, and the material of the second electrode 220 is same as the material of the connection electrode 50.

In a specific implementation process, the second electrodes 220 of the light sensors 200 and the connection electrodes 50 are disposed in the same layer and made of the same material, and the second electrodes 220 of the light sensors 200 and the connection electrodes 50 are both made of metal materials with light reflectivity. The materials of the second electrodes 220 and the connection electrodes 50 may be metal materials such as Al or other metal materials with light reflectivity, which is not limited thereto.

Therefore, the first electrodes or the second electrodes of the light sensors and the connection electrodes are disposed in the same layer and made of the same material, so that the production process is simplified, and the production cost is reduced.

Optionally, as shown in FIGS. 3, 5, 8, 13 and 17, the layer where the first electrode 210 of the light sensor 200 is located is same as the layer where the connection electrode 50 is located, and the material of the first electrode 210 is same as the material of the connection electrode 50. Further, the layer where the second electrode 220 of the light sensor 200 is located is same as the layer where the anode 7-1 of the light emitting device 7 is located, and the material of the second electrode 220 is same as the material of the anode 7-1.

Specifically, the first electrodes 210 of the light sensors 200 and the connection electrodes 50 are both made of transparent conductive materials. The materials of the first electrodes 210 and the connection electrodes 50 may be metal oxides such as ZnO, Indium Tin Oxide (ITO), and Indium Gallium Zinc Oxide (IGZO), or other transparent conductive material, which is not limited thereto. The anodes 7-1 of the light emitting devices 7 generally include the anode metal layers with light reflectivity. Then, the second electrodes 220 of the light sensors 200 and the anodes 7-1 are disposed in the same layer and made of the same material, so that the second electrodes are provided with reflective metal film layers.

Therefore, the first electrodes of the light sensors and the connection electrodes are disposed in the same layer and made of the same material, and the second electrodes of the light sensors and the anodes of the light emitting devices are disposed in the same layer and made of the same material, so that the structure of the display panel is simplified, the production process of the panel is optimized, and the production cost is reduced. On the other hand, since the anodes of the light emitting devices generally include the metal film layers with light reflectivity, the shielding capability of the second electrodes of the light sensors to external ambient light is further enhanced, and the signal-to-noise ratio of the display panel is higher.

Optionally, as shown in FIGS. 4, 9 and 14, the layer where the second electrode 220 of the light sensor 200 is located is same as the layer where the connection electrode 50 is located, and the material of the second electrode 220 is same as the material of the connection electrode 50. The layer where the first electrode 210 of the light sensor 200 is located is same as a layer where the source electrode 4-4 and the drain electrode 4-6 of the thin film transistor structure 4 is located, and the material of the first electrode 210 is same as materials of the source electrode 4-4 and the drain electrode 4-6.

In a specific implementation process, the source electrodes 4-4 and the drain electrodes 4-6 of the thin film transistor structures 4 and the first electrodes 210 of the light sensors 200 are made of transparent materials, and may be metal oxides such as ZnO, Indium Tin Oxide (ITO), and Indium Gallium Zinc Oxide (IGZO), or other transparent conductive materials, which is not limited thereto.

Or, optionally, the layer where the first electrode 210 of the light sensor 200 is located is same as a layer where the gate electrode 4-5 of the thin film transistor structure 4 is located, and the material of the first electrode 210 is same as a material of the gate electrode 4-5.

In a specific implementation process, the gate electrodes of the thin film transistor structures and the first electrodes of the light sensors are made of transparent materials and may be metal oxides such as ZnO, Indium Tin Oxide (ITO), and Indium Gallium Zinc Oxide (IGZO), or other transparent conductive materials, which is not limited thereto.

Therefore, the second electrodes of the light sensors and the connection electrodes are disposed in the same layer and made of the same material, and the first electrodes of the light sensors and the source and drain electrodes or the gate electrodes of the thin film transistor structures are disposed in the same layer and made of the same material, so that the structure of the display panel is simplified, the production process of the panel is optimized, and the production cost is reduced.

Optionally, as shown in FIGS. 6, 7, 8, 9 and 10, the light shading layer 100 is reused as the pixel definition layer 6.

Optionally, as shown in FIGS. 7, 10, 11 and 15, a layer where the first electrode 210 of the light sensor 200 is located is same as a layer where the transparent conductive layer in the anode 7-1 of the light emitting device 7 is located, and the material of the first electrode 210 is same as a material of the transparent conductive layer; and/or, the layer where the second electrode 220 of the light sensor 200 is located is same as the layer where the cathode layer 7-3 of the light emitting device 7 is located, and the material of the second electrode is same as the material of the cathode layer.

In a specific implementation process, since the cathode layers 7-3 of the light emitting devices 7 need to be capable of transmitting light emitted from the active light emitting layers 7-2, the cathode layers 7-3 are made of a transparent conductive material. Then, if the second electrodes 220 of the light sensors 200 and the cathode layers 7-3 of the light emitting devices 7 are disposed in the same layer and made of the same material, light sensor light shading parts 400 need to be disposed between the cathode layers 7-3 and the thin film packaging layer 8, so that the orthographic projection of the light sensor light shading parts 400 on the base substrate 1 can cover the orthographic projection of the second electrodes 220 on the base substrate 1, and it is ensured that external ambient light and internal noise light can be shielded, and light rays are prevented from entering the light sensors 200 from the second electrodes 220.

Therefore, the first electrodes of the light sensors and the transparent conductive layers in the anodes of the light emitting devices are disposed in the same layer and made of the same material; and/or, the second electrodes of the light sensors and the cathode layers of the light emitting devices are disposed in the same layer and made of the same material, so that the structure of the display panel is simplified, the production process of the panel is optimized, and the production cost is reduced.

In a specific implementation process, the layer where the first electrode of the light sensor is located may also same as the layer where the anode of the light emitting device is located, and the material of the first electrode may also same as the material of the anode, which is not limited thereto.

Figure 11:
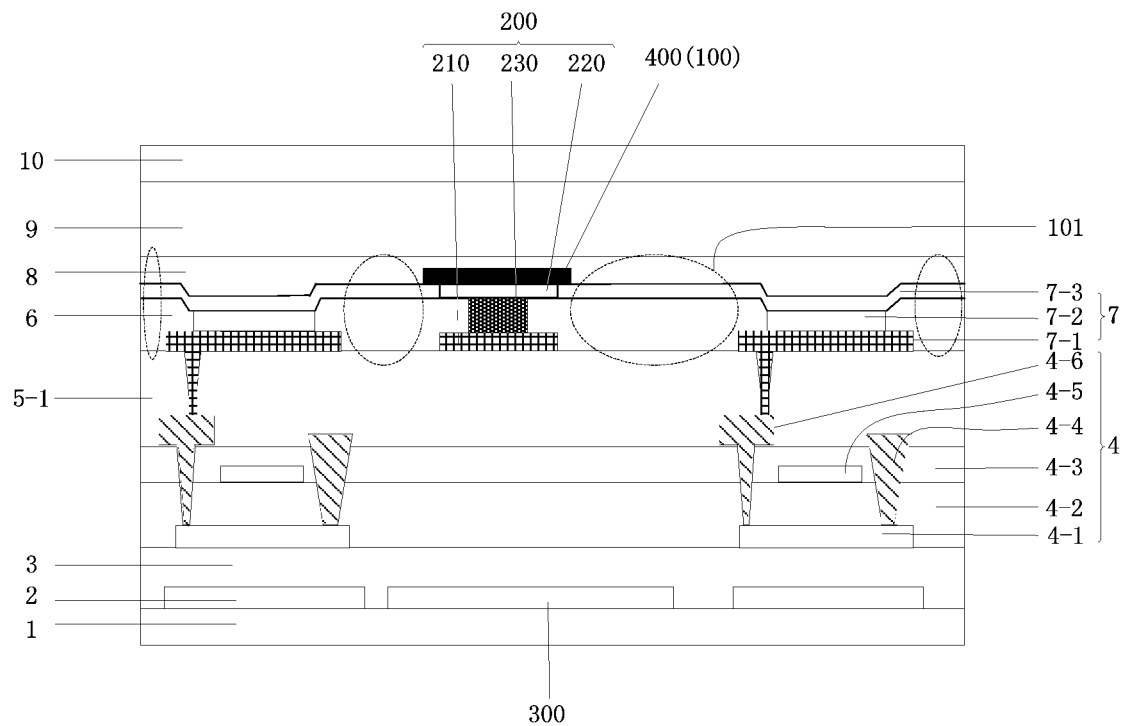
FIG. 11 is an eleventh schematic structural diagram of a display panel according to an embodiment of the present disclosure.
Figure 12:
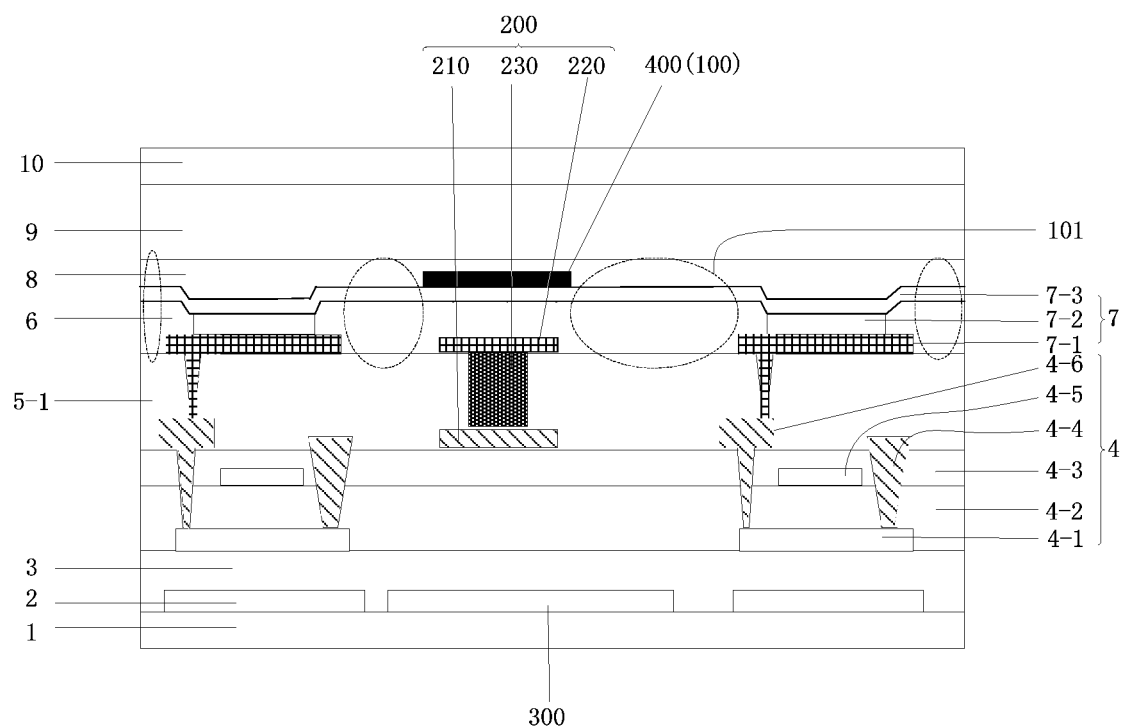
FIG. 12 is a twelfth schematic structural diagram of a display panel according to an embodiment of the present disclosure.
Figure 13:
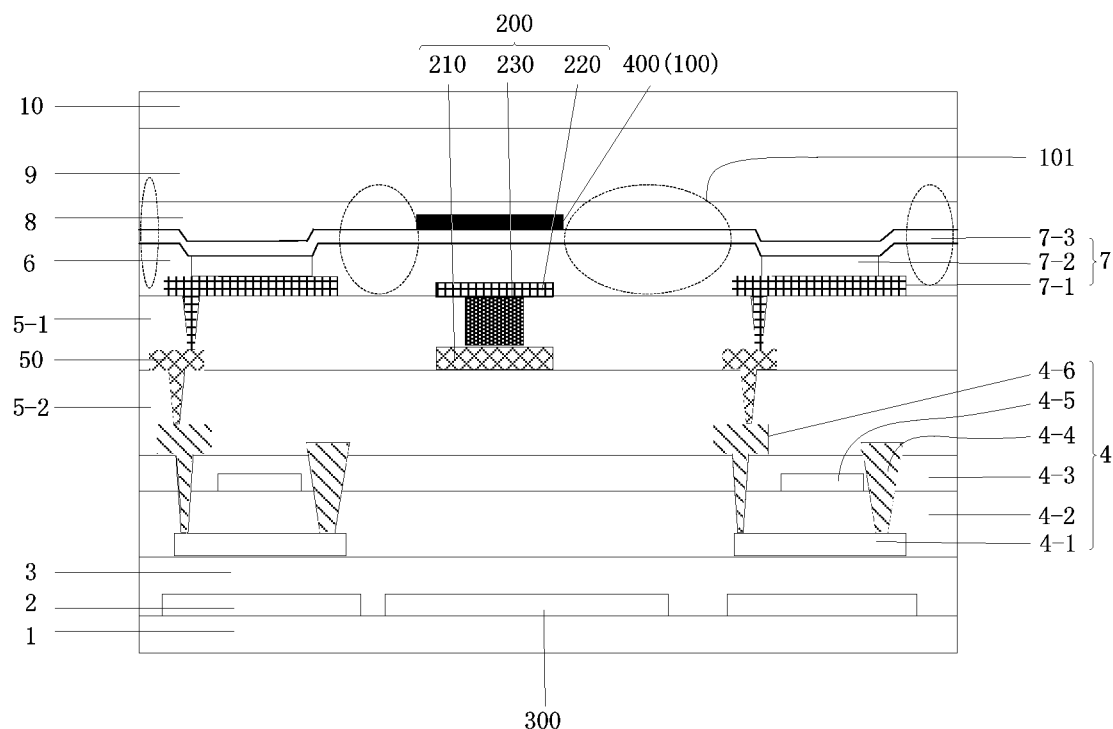
FIG. 13 is a thirteenth schematic structural diagram of a display panel according to an embodiment of the present disclosure.

Optionally, as shown in FIGS. 11, 12 and 13, the light shading layer includes the light shading parts 400 each corresponding to the respective one of the light sensors 200, and an orthographic projection of the light shading parts 400 on the base substrate 1 covers the orthographic projection of the respective one light sensor 200 on the base substrate 1; and the each light-transmitting region 101 corresponding to the respective one light sensor 200 surround the each light shading part 400 corresponding to the respective one light sensor 200.

In a specific implementation process, as shown in FIG. 11, the photoelectric conversion layer 230 of the each light sensor 200 is embedded in the pixel definition layer 6, the first electrode 210 of the light sensor 200 and the transparent conductive layer in the anode 7-1 of the light emitting device 7 are disposed in the same layer and made of the same material, and the second electrode 220 of the light sensor 200 and the cathode layer 7-3 of the light emitting device 7 are disposed in the same layer and made of the same material. The first electrode and the second electrode of the light sensor may also be disposed separately, which is not limited thereto.

Or, as shown in FIGS. 12 and 13, the light sensors 200 are disposed on a side, facing the base substrate 1, of the pixel definition layer 6. As shown in FIG. 12, the first electrodes 210 of the light sensors 200 and the source electrodes 4-4 and the drain electrodes 4-6 of the thin film transistor structures 4 are disposed in the same layer, and the second electrodes 220 of the light sensors 200 and the anodes 7-1 of the light emitting devices 7 are disposed in the same layer. As shown in FIG. 13, the first electrodes 210 of the light sensors 200 and the connection electrodes 50 are disposed in the same layer and made of the same transparent conductive material, and the second electrodes 220 of the light sensors 200 and the anodes 7-1 of the light emitting devices 7 are disposed in the same layer and made of the same material. The first electrodes and the second electrodes of the light sensors may also be disposed separately, or may be disposed in the same layer as other film layers but different from other film layers in material, which is not limited thereto. The light shading parts may also be disposed at any reasonable positions in the direction where the second electrodes of the light sensors face away from the base substrate, which is not limited thereto.

Therefore, the light shading parts in one-to-one correspondence with the light sensors are disposed on the light sensors, the display panel can prevent external ambient light from irradiating the light sensors, meanwhile, the blocking of light rays emitted by the light emitting devices is reduced as much as possible, and the display effect of the display panel is improved.

Optionally, as shown in FIG. 14, the anode 7-1 includes an anode metal layer, and the anode 7-1 is reused as the light shading part 400.

In a specific implementation process, the pattern of each anode 7-1 is disposed in a shape with a larger area than that in the prior art, so that external ambient light can be better shielded. At the same time, gaps are left between the anodes 7-1, and the gaps serve as the light-transmitting regions 101 to transmit light reflected after irradiating the fingerprint to the reflection parts 300.

Therefore, the anode metal layers are reused as the light shading parts, light shading is carried out by utilizing the reflectivity of the metal, and compared with manufacturing a light shading layer by using a dark material, the production cost is reduced.

Optionally, as shown in FIGS. 15, 16 and 17, the second electrode 220 of the light sensor 200 is a metal electrode, and the second electrode 220 of the light sensor 200 is reused as the light shading part 400.

In a specific implementation process, as shown in FIG. 15, the photoelectric conversion layers 230 of the light sensors 200 are embedded in the pixel definition layer 6. Then, the thickness of the photoelectric conversion layers 230 should be set to a small value, for example, in the range of hundreds of nanometers, in order to reduce the light emitted by the light emitting devices 7 from laterally irradiating the photoelectric conversion layers 230. The first electrodes of the light sensors 200 and the anodes 7-1 of the light emitting devices 7 are disposed in the same layer, and the second electrodes of the light sensors 200 and the cathode layers 7-3 of the light emitting devices 7 are disposed in the same layer. Or, as shown in FIGS. 16 and 17, since the anodes 7-1 include the anode metal layers, the second electrodes 220 of the light sensors 200 and the anodes 7-1 of the light emitting devices 7 are disposed in the same layer and made of the same material.

Therefore, the second electrodes of the light sensors are made of the metal material, so that external ambient light is prevented from entering the light sensors, the structure is not additionally added, the production process is simplified, and the production cost is reduced.

Optionally, as shown in FIGS. 2 to 17, the display panel further includes a light shielding layer 2 disposed between the thin film transistor structures 4 and the base substrate 1, the light shielding layer 2 is configured to shield light rays from irradiating the thin film transistor structures 4; and a layer where the reflection part 300 is located is same as a layer where the light shielding layer 2 is located, and a material of the reflection part 300 is same as a material of the light shielding layer 2.

In a specific implementation process, the light shielding layer 2 is generally a metal film layer with light reflectivity, may be a metal material such as Al, or may also be another metal material with light reflectivity, which is not limited thereto.

Therefore, since the reflection parts and the light shielding layer are disposed in the same layer and made of the same material, the structure of the display panel is simplified, the production process of the panel is optimized, and the production cost is reduced.

Based on the same inventive concept, the embodiments of the present disclosure also provide a display apparatus including any display apparatus provided according to the embodiments of the present disclosure. The display apparatus may be: any product or component with a display function, such as a mobile phone, a tablet computer, a television, a display, a notebook computer, a digital photo frame, a navigator and the like. The display apparatus can be implemented by referring to the above-mentioned embodiments of the display panel, and repeated description thereof will not be repeated.

The present disclosure discloses the display panel and the display apparatus. The light shading layer and the reflection parts are additionally disposed on the display panel, so that most external ambient light and noise light inside the display panel are shielded and absorbed by the light shading layer, and the light-transmitting regions on the light shading layer enables light rays reflected after irradiating the fingerprint to pass through the light shading layer and be reflected to the light sensors through the reflection parts, so that the noise light received by the light sensors is reduced and the signal-to-noise ratio is improved.

It will be apparent to those skilled in the art that various modifications and variations can be made in the present disclosure without departing from the spirit or scope of the present disclosure. Thus, it is intended that the present disclosure cover the modifications and variations of this disclosure provided they come within the scope of the appended claims and their equivalents.

What is claimed is:

1. A display panel, comprising:
a base substrate;
a plurality of light emitting devices and a plurality of light sensors, disposed on the base substrate;
thin film transistor structures disposed between the base substrate and the plurality of light emitting devices;
a pixel definition layer configured to define positions of the plurality of light emitting devices;
a first planarization layer disposed on a side of the pixel definition layer facing the base substrate;
a light shading layer; and
reflection parts each corresponding to a respective one of the light sensors;
wherein:
the plurality of light emitting devices are electrically connected with the thin film transistor structures;
the reflection parts are disposed on sides of the light sensors facing the base substrate, and a side of the each light sensor facing the respective one reflection part is a light-entering side of the each light sensor;
light-transmitting regions each corresponding to a respective one of the light sensors are disposed in the light shading layer, and an orthographic projection of the each light-transmitting region on the base substrate is not overlapped with an orthographic projection of the respective one light sensor on the base substrate;
the light shading layer is disposed on a side of the thin film transistor structures facing away from the base substrate; and
at least an overlapping area exists between an orthographic projection of the light shading layer on the base substrate and orthographic projections of the light sensors on the base substrate;
wherein the display panel further comprising:
a light shielding layer disposed between the thin film transistor structures and the base substrate;
the light shielding layer configured to shield light rays on a side of the base substrate facing away from the light shielding layer from irradiating the thin film transistor structures; and
a layer where the reflection parts are located is same as a layer where the light shielding layer is located, and a material of the reflection parts is same as a material of the light shielding layer.

2. The display panel according to claim 1, wherein:
each of the light sensors comprises:
a first electrode, a photoelectric conversion layer and a second electrode stacked sequentially;
wherein a material of the first electrodes is a transparent conductive material; and
the first electrode is disposed between the photoelectric conversion layer and the base substrate; and
each of the light emitting devices comprises:
an anode, a light emitting layer and a cathode layer;
wherein the anode, the light emitting layer and the cathode layer are stacked, and the anode is disposed between the light emitting layer and the base substrate.

3. The display panel according to claim 2, wherein:
the light shading layer:
  is disposed between the pixel definition layer and the thin film transistor structures; or
  is reused as the pixel definition layer; and
the light sensors:
  are disposed between the light shading layer and the reflection parts; or
  penetrate through the light shading layer in a direction perpendicular to the base substrate.

4. The display panel according to claim 3, wherein:
the light shading layer is disposed between the thin film transistor structures and the plurality of light emitting devices, and the light shading layer is reused as the first planarization layer; and
the plurality of light emitting devices and the thin film transistor structures are electrically connected through via holes penetrating through the first planarization layer.

5. The display panel according to claim 4, wherein:
a layer where the second electrode of the light sensor is located is same as a layer where the anode of the light emitting device is located; and
a material of the second electrode is same as a material of the anode.

6. The display panel according to claim 4, further comprising:
a second planarization layer disposed between the first planarization layer and the thin film transistor structures; and
a connection electrode disposed between the second planarization layer and the first planarization layer;
wherein the plurality of light emitting devices are electrically connected with the thin film transistor structures through the connection electrode.

7. The display panel according to claim 6, wherein:
a layer where the first electrode or the second electrode of the light sensor is located is same as a layer where the connection electrode is located; and
a material of the first electrode or the second electrode is same as a material of the connection electrode.

8. The display panel according to claim 7, wherein:
the layer where the first electrode of the light sensor is located is same as the layer where the connection electrode is located, and the material of the first electrode is same as the material of the connection electrode; and
the layer where the second electrode of the light sensor is located is same as a layer where the anode of the light emitting device is located, and the material of second electrode is same as a material of the anode.

9. The display panel according to claim 7, wherein:
the layer where the second electrode of the light sensor is located is same as the layer where the connection electrode is located, and the material of the second electrode is same as the material of the connection electrode; and
the layer where the first electrode of the light sensor is located is same as a layer where source and drain electrodes or gate electrodes of the thin film transistor structures are located, and the material of the first electrode is same as a material of the drain electrodes or the gate electrodes of the thin film transistor structures.

10. The display panel according to claim 3, wherein:
the light shading layer is reused as the pixel definition layer;
a layer where the first electrode of the light sensor is located is same as a layer where a transparent conductive layer in the anode of the light emitting device is located; and the material of the first electrode is same as a material of the transparent conductive layer;
and/or,
a layer where the second electrode of the light sensor is located is same as a layer where the cathode layer of the light emitting device is located, and a material of the second electrode is same as a material of the cathode layer.

11. The display panel according to claim 2, wherein:
the light shading layer comprises light shading parts each corresponding to the respective one of light sensors, and an orthographic projection of the each light shading part on the base substrate covers the orthographic projection of the respective one light sensor on the base substrate; and
the each light-transmitting region corresponding to the respective one light sensor surround the each light shading part corresponding to the respective one light sensor.

12. The display panel according to claim 11, wherein the anode comprises an anode metal layer, and the anode is reused as the light shading part.

13. The display panel according to claim 11, wherein:
the second electrode of the light sensors is a metal electrode; and
the second electrode of the light sensor is reused as the light shading part corresponding to the light sensor.

14. A display apparatus, comprising the display panel described according to claim 1.

* * * * *